United States Patent [19]

Martin et al.

[11] Patent Number: 5,551,959
[45] Date of Patent: Sep. 3, 1996

[54] ABRASIVE ARTICLE HAVING A DIAMOND-LIKE COATING LAYER AND METHOD FOR MAKING SAME

[75] Inventors: Lawrence L. Martin, Maplewood; David G. O'Neill; Moses M. David, both of Woodbury, all of Minn.

[73] Assignee: Minnesota Mining and Manufacturing Company, St. Paul, Minn.

[21] Appl. No.: 294,919

[22] Filed: Aug. 24, 1994

[51] Int. Cl.⁶ ............................................. B24D 11/00
[52] U.S. Cl. ........................... 51/295; 51/297; 51/306
[58] Field of Search .......................... 51/295, 297, 306

[56] References Cited

U.S. PATENT DOCUMENTS

| | | | |
|---|---|---|---|
| 3,351,543 | 11/1967 | Vanderslice | 204/192 |
| 3,508,890 | 4/1970 | Fontanella | 51/295 |
| 3,874,900 | 4/1975 | Post et al. | 117/69 |
| 3,992,178 | 11/1976 | Markoo et al. | 51/295 |
| 4,115,959 | 9/1978 | McCormick | 51/295 |
| 4,505,720 | 3/1985 | Gabor et al. | 51/295 |
| 4,746,563 | 5/1988 | Nakono et al. | 428/216 |
| 4,778,730 | 10/1988 | Zucker | 428/552 |
| 4,842,937 | 6/1989 | Meyer et al. | 428/408 |
| 4,859,493 | 8/1989 | Lemelson | 427/45.1 |
| 4,974,373 | 12/1990 | Kawashima et al. | 51/295 |
| 4,981,717 | 1/1991 | Thaler | 427/53.1 |
| 4,992,082 | 2/1991 | Drawl et al. | 51/295 |
| 5,085,671 | 2/1992 | Martin et al. | 51/293 |
| 5,104,509 | 4/1992 | Buck et al. | 204/192.38 |
| 5,127,924 | 7/1992 | Russell | 51/295 |
| 5,190,807 | 3/1993 | Kimock et al. | 428/216 |
| 5,225,275 | 7/1993 | Aida | 51/307 |
| 5,250,086 | 10/1993 | McEachron et al. | 51/309 |
| 5,286,541 | 2/1994 | Darjee et al. | 428/40 |
| 5,310,596 | 5/1994 | Bigelow et al. | 51/309 |
| 5,318,836 | 6/1994 | Ito et al. | 51/295 |
| 5,370,912 | 12/1994 | Bigelow et al. | 427/575 |
| 5,401,543 | 3/1995 | O'Neill et al. | 427/580 |

FOREIGN PATENT DOCUMENTS

| | | |
|---|---|---|
| 2438601 | 2/1976 | Germany . |
| 62-218071 | 9/1987 | Japan . |
| 63-262468 | 10/1988 | Japan . |
| 63-284285 | 11/1988 | Japan . |
| 1-113485 | 5/1989 | Japan . |
| 1-139753 | 6/1989 | Japan . |
| 2-229878 | 9/1990 | Japan . |
| 2-269790 | 11/1990 | Japan . |
| 4-19076 | 1/1992 | Japan . |
| 6-29401 | 4/1994 | Japan . |
| WO9514553 | 6/1995 | WIPO . |

OTHER PUBLICATIONS

Diamond and Related Materials, vol. 4, No. 7, 15 May 1995, Lausanne, Ch, pp. 921–929, D. G. Bhat, et al., "A Preliminary Investigation of the Effect of Post–Deposition Polishing of Diamond Films on the Machining Behavior of Diamomd–Coated Cutting Tools".

G. Dearnaley, "Altering Materials Surfaces to Prolong Service Life", Techn. Today, Mar., 1994, pp. 8–13.

*Primary Examiner*—Deborah Jones
*Attorney, Agent, or Firm*—Gary L. Griswold; Walter N. Kirn; Richard Francis

[57] ABSTRACT

An abrasive article having a sheet-like substrate having at least one major surface; an abrasive coating adhered to the at least one major surface of the substrate, wherein the abrasive coating comprises a plurality of abrasive particles and an organic binder medium; and, a hard carbon coating layer comprising a diamond-like carbon film. The hard carbon coating layer in the coated abrasive article can be provided as a top coat or, alternatively, as located between the abrasive coating and a covering layer based on an organic binder layer. The invention also pertains to a method of making such an abrasive article.

17 Claims, 2 Drawing Sheets

ABRASIVE ARTICLE HAVING A DIAMOND-LIKE COATING LAYER AND METHOD FOR MAKING SAME

BACKGROUND OF THE INVENTION

1. Field of the Invention

The present invention relates to an improved abrasive article having a diamond-like carbon coating layer.

2. Discussion of the Related Art

It has been proposed to improve the wet or lubricated grinding ability of a coated abrasive article by forming one or more oxide-forming metal layers or metal oxide layers on the surface of abrasive particles after the particles have been applied to the make coat of a coated abrasive article, such as described in U.S. Pat. No. 3,508,890 (Fontanella). The metal, usually upon being heated in air, converts to metal oxide. A second and third layer of metal oxide can optionally be coated. The metal oxide layers, usually relatively thick at 1500 to 10,000 Angstroms, act as the size coat. The process is preferably done via vacuum deposition. Also, U.S. Pat. No. 3,992,178 (Markoo et al.) describes forming a graphite outer layer on a flexible abrasive article as an electroconductive layer used to dissipate electrostatic charges that may build-up in the abrasive article during service.

It also is generally known to coat a substrate material with polycrystalline diamond films where the diamond precursor material was condensed from a vapor phase as a continuous film onto the surface of substrate. The phase of the carbon is controlled during formation by known methods to produce a desired metastable diamond state having long range crystalline $sp^3$ orbitals so as to avoid the tendency of the carbon material to otherwise assume the more thermodynamically stable but undesired state, i.e. graphite, having a high fraction of $sp^2$ carbon orbitals.

Diamond-like carbon films, commonly referred to as "DLC" films, are coatings that can be produced in generally the same manner as polycrystalline diamond coatings and have the same properties, but unlike diamond coatings, diamond-like carbon coatings are amorphous rather than crystalline. The DLC films also have excellent properties usually associated with abrasives, such as low surface friction and high hardness. Naturally occurring crystalline diamond is usually formed from a network of $sp^3$ carbon orbitals, arranged in a local tetrahedral symmetry yet maintaining long range crystalline order. However, amorphous diamond-like carbon, or "DLC" for short, has a random alternation between tetrahedral $sp^3$ and hexagonal $sp^2$ carbon orbitals. In addition, there is no detectable long range order of these orbitals in DLC (T.E.M. measurements have placed an upper limit of 50 Å for long range order).

In general, two known categories of diamond-like, amorphous carbon films can be deposited on an article, depending on the origin of the carbon source and deposition process. Hydrogenated DLC films are obtained from hydrocarbon sources, such as $CH_4$, which, for instance, are plasma deposited, whereas non-hydrogenated DLC films are obtained from solid carbon, such as graphite. Hydrogenated DLC films are comprised of molecule segments (C-H) with the carbon matrix having about 0.2 to 0.6 atom fraction hydrogen within the matrix. Plasma deposited amorphous hydrogenated carbon typically has a density of about 2.0 g/cc and a hardness of about 10–40 GPa.

On the other hand, non-hydrogenated DLC films have a disordered arrangement of tetrahedral and hexagonal bonds. Non-hydrogenated DLC films are produced essentially from pure carbon with little or no hydrogen, preferably from a highly ionized source where the ion fraction is preferably greater than 50%. The non-hydrogenated diamond-like carbons like their hydrogenated counterparts, do not have any long range order, however they do have a significant fraction of pure carbon $sp^3$ bonds. The ratio of the $sp^3$ bonds to $Sp^2$ bonds determines the material's physical properties.

The $sp^3/sp^2$ bond ratio can be estimated from the plasmon energy determined by electron energy loss spectroscopy (EELS). The plasmon energy is proportional to the square root of the atom density. Diamond has a greater atom density and thus plasmon energy than graphite. Polycrystalline graphite has a plasmon energy measured by EELS of about 25 electron volts (eV). Diamond has a plasmon energy of about 33 eV. Non-hydrogenated diamond-like carbon has a plasmon energy between about 26 and 32 eV, the higher plasmon energies corresponding to higher atom densities which are believed to be due to an increased $sp^3$ bonding component. Also, a non-hydrogenated amorphous diamond-like carbon coating typically has a density of about 3.0 g/cc and a hardness of about 100 GPa, whereas natural diamond typically has a density of about 3.5 g/cc and a hardness of about 100 GPa.

Hydrogen-free non-crystalline diamond-like carbon coatings can also be produced using cathodic arc plasma deposition, a process which provides a highly ionized carbon plasma, high deposition rates and allows control over the incident ion kinetic energy and the substrate temperature. The $sp^3/sp^2$ bond ratio is believed to be dependent on the ion fraction and the incident kinetic energy. Cathodic arc plasma deposition can produce diamond-like carbon coatings with higher plasmon energies than alternative processes, thus, yielding higher $sp^3/sp^2$ bond ratios.

A cathodic arc discharge occurs when a high current power source is connected between two sufficiently conductive electrodes and the electrodes are momentarily in contact, either physically or by another discharge. Arc spots form on the cathode surface as the electrodes are separated. These small, luminous regions are often very mobile and move rapidly over the cathode surface. Due to the high current density contained in each spot, rapid ebullition of the cathode material occurs, and this plasma material can be confined, transported using magnetic fields and deposited onto substrates. The current density at each spot can reach $10^6$ to $10^8$ amperes per square centimeter and this is believed to contribute to the ionization of a large amount of the outflowing vapor.

As to more specific known abrasive applications of diamond and DLC film coatings, there have been many attempts to coat diamond films and diamond-like carbon films of various thicknesses onto individual loose abrasive particles and then utilize the particles in abrasive articles.

For instance, published Japanese Application No. JP 63-284285 (21 Nov. 1988) coats silicon carbide grains with a layer of diamond via chemical vapor deposition to increase the wear resistance of the grain. The silicon carbide is preferably 5 to 50 micrometers in size and the coatings are preferably 0.1 to 50 micrometers thick. It is said that a coating less than 0.1 micrometer shows no improvement in wear resistance. Also, published Japanese Application No. JP 1-113485 (2 May 1989), which matured into Japanese Patent Publication No. 6-29401 (20 Apr. 1994), describes alumina, zirconia, or silicon carbide abrasive particles coated with diamond or cubic boron nitride via chemical vapor deposition processes. The particles are described for use in grinding wheels, cutting blades, and finishing work. The coatings are 0.5 to 10 micrometers thick.

However, there are several disadvantages in applying a diamond or diamond-like carbon coating over the surface of abrasive particles on an individual basis. Abrasive particles, especially the smaller particle sizes, have a relatively high surface area. In addition, these coatings are typically applied by physical vapor deposition (PVD) or chemical vapor deposition (CVD) and, as such, these processes are fairly expensive. The large surface area coupled with typical deposition rates, results in a considerable amount of time, and thus cost, needed in order to apply the coating to loose abrasive particles since the coating techniques tend to be directional. In addition, it can be difficult to obtain a uniform coating over the entire surface area of loose abrasive particles.

Also, both diamond films and diamond-like carbon films have been used as a surface coating for nonparticulate articles such as electrical components, wafers, optical lenses, and cutting tools. For instance, U.S. Pat. No. 4,981,717 (Thaler) mentions forming certain diamond-like carbon coatings said to be excellent, when made in larger deposits, as abrasive coatings and being suitable for grinding wheels, among other things. Yet, Thaler only exemplfies coating inorganic materials such as metal and glass as the mentioned substrates. Also, U.S. Pat. No. 4,842,937 (Meyer et al.) coats an abrasive cutting tool surface with a succession of diamond-containing layers to form a wear-protective layer. The multiple layers are applied by chemical vapor or plasma deposition one on top of the other so that the uppermost layer is a diamond film, and each following layer has a different diamond content than the preceding layer. Nickel, cobalt or graphite is described as being usable as binding material in the layers.

Also, U.S. Pat. No. 4,992,082 (Drawl et al.) describes forming a diamond or diamond-like carbon coated tool having several layers of CVD diamond or diamond-like carbon particles separated by interposing and covering planarizing layers described as being nonorganic nonresinous materials such as transition metals, transition metal carbides, boron, boron carbide silicon, silicon nitride, and silicon carbide.

U.S. Pat. No. 4,974,373 (Kawashima et al.) discloses the making of coated abrasive articles having a monolayer of abrasive particles. The abrasive article can be coated with a thin film, e.g., a hard carbon, formed by plasma synthesis or other technique so as to protect the outer tool surface. Plasma deposited amorphous "hydrogenated" carbon (i.e., only 30–60% $sp^3$ bonded fraction) and techniques for making same were known and available at the time of Kawashima et al. However, plasma deposited amorphous hydrogenated carbon has a relatively low hardness of only about 10–40 GPa.

U.S. Pat. No. 5,401,543 filed 11 Nov. 1993 (O'Neill et al.) and assigned to the assignee of the current invention, teaches a method of making diamond-like coatings and coated articles made thereby, such as semiconductors, with the use of vitreous graphite or glassy carbon as a cathode material for cathodic arc coating.

It is not believed that the art has heretofore reported the provision of a layer of diamond-like carbon as a layer of a coated abrasive article.

SUMMARY OF THE INVENTION

The present invention concerns an abrasive article providing improved cutting performance. The abrasive article of the invention includes a substrate in sheet form, an abrasive coating comprised of abrasive particles which are at least partially embedded in an organic binder material, and a hard carbon coating layer composed of diamond-like carbon material.

By way of further explanation, the abrasive article includes a substrate, sometimes referred to as a backing, and a first organic binder material, commonly referred to as a make coat. This make coat is present on the front side of the substrate (i.e., the side of the abrasive article intended to face a workpiece to be abraded), and abrasive particles are embedded in the make coat to form an abrasive coating. A second organic binder material, commonly referred to as a size coat is also present. The size coat reinforces the abrasive particles and helps anchor them to the make coat.

In one embodiment of this invention, the hard carbon coating layer of diamond-like carbon material is provided as an integral adherant layer situated as an exposed topcoat on the size coat of the abrasive article.

In an alternative embodiment of this invention, the hard carbon coating layer of diamond-like carbon material is an intermediate layer situated between the abrasive coating (i.e., make coat and abrasive particles) and the organic binder-based size coat layer of the abrasive article of this invention. The hard carbon coating layer of diamond-like carbon material, when employed as an interior layer within the strata of layers constituting the abrasive article, can be variously arranged as where (1) the hard carbon coating layer is directly formed upon the upper exposed surface of the abrasive coating followed by applying a size coat based on organic binder over the hard carbon coating layer, or, (2) an alternate arrangement where a size coat based on organic binder is first disposed on the abrasive coating, then the hard carbon coating layer is formed thereon followed by applying a super-size coat also based on organic binder over the hard carbon coating layer.

For purposes of this invention, the phrase "diamond-like carbon" film, which is also occasionally referred to herein in the abbreviated form of "DLC", is meant to encompass amorphous carbon films having a plasmon energy of 26 eV or more. In a further embodiment, the "DLC" amorphous carbon films contemplated for this invention have a plasmon energy between 26 eV and 32 eV. As a frame of reference, polycrystalline graphite has a plasmon energy of about 25.5 eV; diamond has a plasmon energy of about 32 eV; and amorphous "hydrogenated" carbon coatings have plasmon energies below 24 eV.

The plasmon energy of the DLC film is determined using Electron Energy Loss Spectroscopy (EELS). The plasmon energy is related to the structural properties of the DLC film because it is proportional to the valence electron density which is proportional to the atom density. The plasmon energy of the DLC films is measured in the reflective mode where a 2000 eV electron beam is reflected off the diamond-like carbon film, wherein the DLC film does not have to be separated from the substrate. A fraction of the incident beam looses energy by creating plasmons. The energy loss measured is the plasmon energy.

For purposes of this invention, the term "film", as used in connection with a diamond-like carbon (DLC) layer, means a monolithic layer of less than 50 micrometers in average thickness having a uniformity in thickness within 20% of its average value. For purposes of this invention, "integral" is intended to denote that the diamond-like layer is complete in itself. For purposes of this invention, "adherant" denotes that the hard coating is substantially firmly bonded to the surface of an organic binder medium, with or without abrasive particles present therein.

The advantages achieved in the present invention by the provision of the hard carbon coating layer of diamond-like carbon in the abrasive article, whether as a top coat or interior layer therein, are that the cut rate and total cut are improved as compared to abrasive articles lacking the hard carbon coating layer employed in the present invention.

For purposes of this invention, the substrate is charcterized as being in "sheet form" or as being "sheet-like" both meaning the substrate is a relatively thin material having a broad, flat continuous surface.

The abrasive coating of the abrasive article of this invention can be formed in several different manners. In this regard, the abrasive coating can be formed to provide any of a coated abrasive article, a lapping abrasive article, or a structured abrasive article. For example, the abrasive coating can be provided in a coated abrasive article scheme where abrasive particles are deposited onto a preapplied make coat and are adhesively fixed in a partially embedded position therein. Alternatively, the abrasive coating can be formed from a premixed abrasive slurry of organic binder medium and a plurality of abrasive particles before the slurry is applied by coating onto a substrate of the abrasive article. In the lapping abrasive article scheme, the abrasive slurry is formed on the substrate as a coating. This coating may be smooth or have an associated texture. For purposes of the lapping abrasive article, the abrasive slurry is not shaped into three-dimensional microstructures projecting outwardly away from the surface of the substrate. Alternatively, the abrasive slurry can be shaped into three-dimensional surface structures to form a so-called structured abrasive article. More particularly, for purposes of this invention, the phrase "structured abrasive article" means an abrasive article wherein a plurality of shaped abrasive composites, each composite comprising abrasive particles distributed in a binder having a predetermined three-dimensional shape projecting outward from the surface of the substrate of the abrasive article, are disposed on a backing in an array.

The abrasive article of the invention can be used in any convenient form, such as an endless belt, disc, tape, or sheet. The abrasive particle of the abrasive article can be any known type of abrasive particle, but preferably is an alumina based abrasive particle.

In another embodiment of the present invention, there is a method for making the aforesaid abrasive articles, comprising the steps of:

(a) providing an abrasive layer comprising an organic binder medium and a plurality of abrasive particles, said abrasive layer having an exposed abrasive surface; and (b) applying a diamond-like carbon coating over said abrasive surface.

In one preferred method of making the aforesaid abrasive articles of this invention, the method comprises the steps of:

(a) providing a substrate having a sheet-like structure having at least one major surface;

(b) forming an abrasive coating on said at least one major surface of said substrate, wherein said abrasive coating comprises a plurality of abrasive particles and an organic binder medium;

(c) applying sufficient current to a carbonaceous cathode to form a plasma of carbon constituents forming said cathode;

(d) permitting said plasma to be directed in a path through an anode;

(e) maintaining said abrasive coating within said path at a temperature sufficiently low effective to prevent substantial degradation of said organic binder medium, whereby forming a diamond-like carbon film on said abrasive coating; and (f) discontinuing steps c–e after said diamond-like carbon film achieves an average thickness of at least about 100 Angstroms.

In one further embodiment of this method of the invention, the hard carbon coating layer of diamond-like carbon material is further coated and covered with at least one size coat layer comprising an organic binder medium. Alternatively, the hard carbon coating layer is left uncovered and exposed as the uppermost or top coat of the abrasive article as ultimately put into service for grinding and/or surface abrading operations performed with the abrasive article of the invention.

Other features, advantages, and constructs of the invention will be better understood from the following description of figures and the preferred embodiments of the present invention.

DETAILED DESCRIPTION OF THE PREFERRED EMBODIMENTS

The present invention relates to an abrasive article having a substrate in sheet form, including an abrasive coating comprised of abrasive particles which are at least partially embedded in an organic binder material, and a hard carbon coating layer composed of diamond-like carbon material. The hard carbon coating layer can be situated as either a top coat or interior layer thereof. The abrasive article, as such, provides improved cutting performance.

Figure 1:
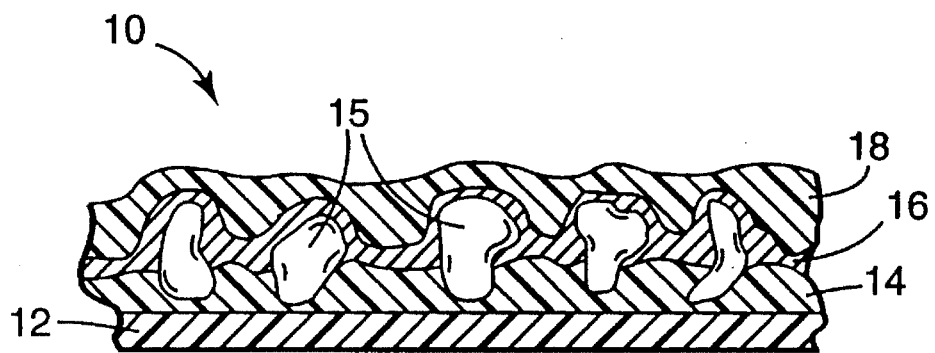
FIG. 1 is an enlarged cross section view of a segment of an abrasive article of the present invention.

By way of illustration, FIG. 1 is a cross section view of a representative segment of one type of abrasive article of the present invention, viz. a coated abrasive article of the invention. In FIG. 1, abrasive article 10 includes a make coat 14 over substrate (backing) 12, and abrasive particles 15 deposited into make coat 14 before it completely dries or cures by known methods to form an abrasive coating. The abrasive coating is formed of the make coat 14 and the abrasive particles 15. A hard carbon coating layer 16 of diamond-like carbon material is deposited over make coat 14 and abrasive particles 15. Hard carbon coating layer 16 is covered by size coat 18. Optionally, a supersize coat comprising an organic binder medium can be formed over the size coat 18. In any event, the hard coating of diamond-like carbon 16 is formed over the make coat 14 and abrasive particles 15 and under the size coat 18, and, thus, the hard carbon coating layer 16 is an intermediate layer and is not a top coat. Advantages of this arrangement, for example, include: 1) less time is required to apply DLC to the abrasive coating layer than coating the entire surface area of the individual particles; 2) coating DLC adjacent the abrasive particles provides advantageous grinding performance; and 3) the bottom part of abrasive particles, which do not ordinarily participate in the grinding, are not needlessly DLC coated.

A make coat is the layer of binder which is directly applied on the substrate (excluding the substrate presizes or treatments). The abrasive particles are deposited onto and into the make coat to form the abrasive coating. A size coat is then applied over the abrasive particles. Preferably, the size coat is applied while in a flowable or liquid state, and then solidified. An optional supersize coat, an organic resin medium often comprising a grinding aid or anti-loading additive, can be applied over the size coat.

Figure 2:
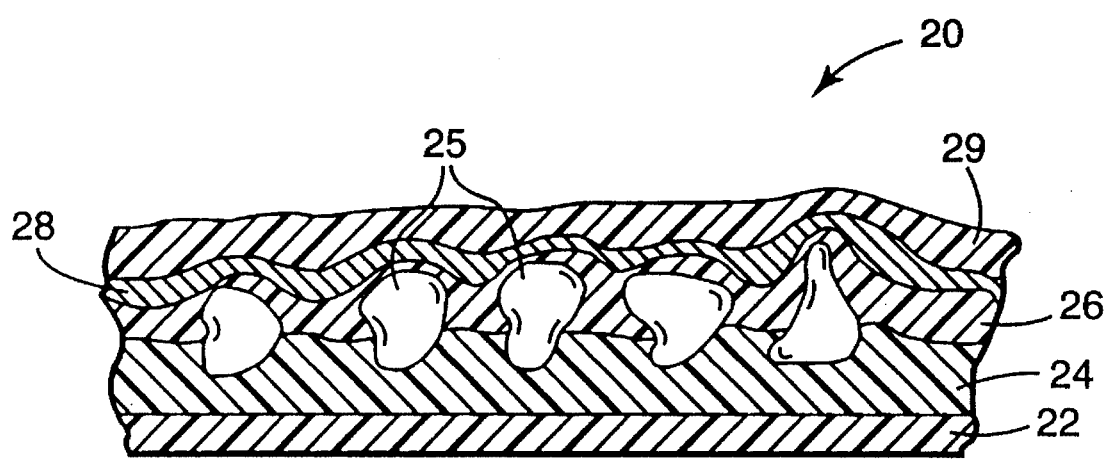
FIG. 2 is an enlarged cross section segment view of another embodiment of the abrasive article of the present invention.

FIG. 2 is a cross section segment view of another embodiment of an abrasive article of the present invention where the diamond-like carbon film is provided in a different arrangement as an interior layer in the strata of layers on the working side of the coated abrasive article. Abrasive article 20 has a substrate or backing 22. A make coat 24 is applied upon backing 22, then abrasive particles 25 are deposited therein in partially embedded form to form an abrasive coating. A size coat 26 is applied over the make coat 24 and abrasive particles 25. A hard carbon coating layer 28 of diamond-like carbon film is applied over size coat 26. Hard carbon coating layer 28 is covered with supersize coat 29. It is also within the scope of the invention to form separate DLC coatings in the abrasive article, such as forming a DLC film over each of the abrasive coating and also over the size and supersize coat.

Figure 3:
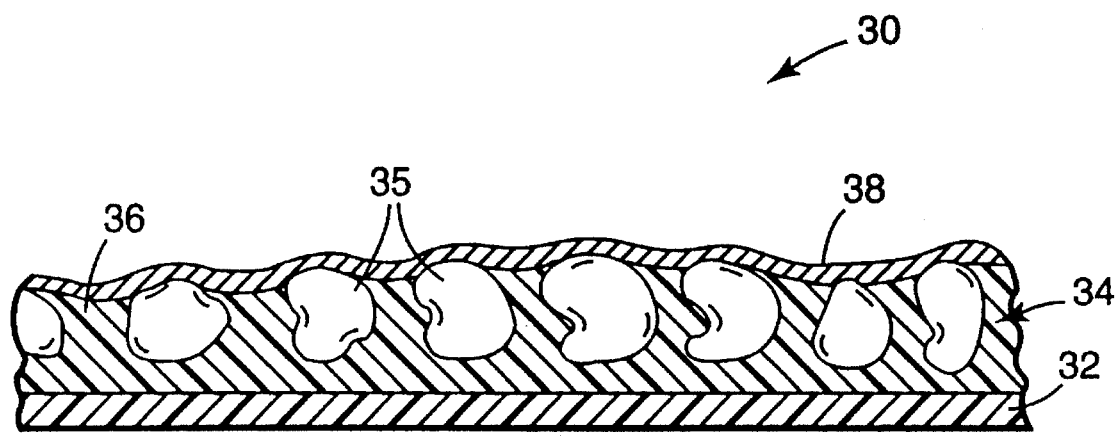
FIG. 3 is an enlarged cross section segment view of yet another embodiment of the abrasive article of the present invention.

FIG. 3 is a cross section segment view of a different embodiment of an abrasive article of the present invention where the DLC coating is provided as a top coat and uppermost surface of the working side of the coated abrasive article, which is a lapping abrasive article in this embodiment. Abrasive article 30 has a flexible backing 32. Abrasive coating 34 is applied upon backing 32 comprising abrasive particles 35 and binder 36. A hard carbon coating layer 38 of diamond-like carbon film is applied over abrasive coating 34. Hard carbon coating layer 38 is left uncovered and exposed. An advantage of this arrangement is that the DLC coating, as a top coat, can make the coated abrasive construction more durable since the DLC coating will be less likely to crack and chip off than a conventional size coat.

Figure 4:
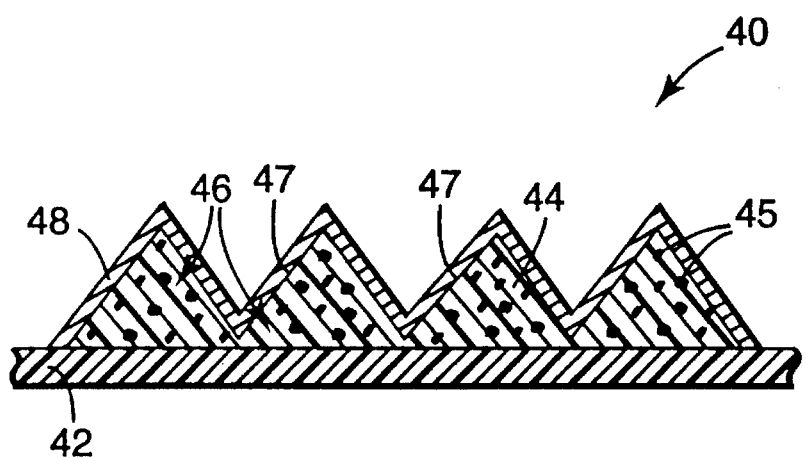
FIG. 4 is an enlarged cross section segment view of another embodiment of the abrasive article of the present invention.

FIG. 4 is a cross section segment view of another embodiment of an abrasive article of the present invention where the DLC coating film is provided as a top coat and uppermost surface of the working side of the coated abrasive article, which is a structured abrasive article in this embodiment. Abrasive article 40 has a flexible backing 42. Backing 42 bears a plurality of abrasive composites 46 comprising a plurality of abrasive particles 45 dispersed in a binder 44. The composites 46 have outer surfaces 47 defining three-dimensional shapes in terms of their outer surface profile or contour. The shapes can be made by methods into discrete isolated shapes or into ridges of abrasive material by known techniques, such as described in U.S. Pat. Nos. 5,152,917 (Pieper et al.), 5,304,223 (Pieper et al.), and U.S. Pat. No. 5,435,816 (Spurgeon et al.) and PCT Publication No. WO 95/07797 (Hoopman et al.), which are each incorporated herein by reference. Then, a hard carbon coating layer 48 of diamond-like carbon film is applied over the abrasive composites 46. Hard carbon coating layer 48 is left uncovered and exposed.

It is generally preferred that the binder, make coat, size coat, and supersize coats, such as exemplified variously in the embodiments of FIGS. 1–4, are based preferably on organic, thermosetting polymers; although thermoplastic binders also can be used.

Hard Carbon Coating Layer: the DLC Film

The diamond-like carbon film, which is also occasionally referred to herein in the abbreviated form of "DLC" is meant to encompass amorphous carbon films having a plasmon energy of 26 eV or more. The plasmon energy of the DLC films of the invention generally fall in the range of 26 eV to 30 eV and is typical of cathodic arc deposited DLC material. The plasmon energy of the DLC film is determined using Electron Energy Loss Spectroscopy (EELS). As explained above, the plasmon energy is related to the structural properties of the DLC film because it is proportional to the valence electron density which is proportional to the atom density. The plasmon energy of the DLC films is measured in the reflective mode with a beam energy of about 2000 eV wherein the DLC film does not have to be separated from the substrate.

The average thickness of the hard carbon coating layer or film of diamond-like carbon material in this invention is usually less than 50 micrometers, preferably less than 10 micrometers, more preferably less than 1 micrometer, and most preferably in the range of 100 to 5000 Angstroms. A DLC film thickness above 5000 Angstroms may not be desirable in all cases as it becomes relatively expensive to make, and can become too brittle and lose adhesion. On the other hand, a DLC thickness below 100 Angstroms may not be desirable in all cases as not being thick enough to impart the improved cutting performance sought.

The number of hard carbon coating layers can vary from one to a plurality without any particular limitation thereon. That is, it is possible that there is provided more than one hard carbon coating layer within the strata of layers constituting the coated abrasive article and at different locations therein. For instance, several separate layers of the DLC material can be formed variously on the abrasive coating, size coating and/or supersize coating.

The coating period to obtain the desired thickness can range from about 10 seconds to about 10 hours, usually between about 30 seconds and about 10 minutes when using cathodic arc plasma deposition. The chamber atmosphere, carbon source, and power can be controlled to adjust the coating time in ways understood by those of skill in the cathodic arc coating field.

Other methods of producing the diamond-like carbon films, either hydrogenated or non-hydrogenated varieties, include generally known techniques such as chemical vapor deposition (CVD), plasma assisted CVD, ion beam, laser ablation, RF plasma, microwave, arc discharge, and cathodic arc plasma deposition.

In one preferred embodiment, a cathodic arc coater is used to deposit the diamond-like carbon films in the present invention. The cathodic arc coater is of a horizontal configuration arranged with approximately 90 centimeters distance provided between the cathode and the article to be coated. However, distances ranging from 5 to 500 cm are feasible between the cathode and the article to be coated as long as appropriate measures, described herein, are taken to sufficiently restrain the temperature build-up of the abrasive article to prevent graphitization of the diamond-like carbon film formed and being formed. The relatively large separation between the arc source and the sample article allows the diamond-like carbon coating to be deposited at temperatures conducive for DLC formation and yet at lower temperatures than those usually experienced and employed for diamond coating. The distance also allows an optional macroparticle filter to be employed, such as described in U.S. Pat. No. 5,401,543 (O'Neill et al.), filed Nov. 11, 1993, which is incorporated herein by reference. Also, the typical centered holder preferably is replaced in the practice of the present invention with a rotating holder which is offset from the center of the plasma such that the outer portions of the holder would be covered by the plasma. By placing a disc on the holder and then rotating the disc, it is possible to expose the outer 2 inches (5 cm) of the disc to the center of the plasma region and, as a consequence, it is possible to uniformly coat the outer surface (grinding) portion of the disc. It is also within the scope of this invention to only coat a region or portion of the abrasive coating. For example, in a coated abrasive disc only the outer few centimeters could be coated.

In order to produce diamond-like carbon films, the cathodic arc coater has a carbon source as the cathode material. Various materials usable as the cathode material include, pyrolytic graphite, amorphous carbon, graphite, and vitreous carbon. The coating procedure is usually performed in a vacuum, usually less than $10^{-4}$ torr. The residual gas atoms can be either ambient air (nitrogen and oxygen) or an inert gas.

It is preferred that the abrasive coating of the abrasive article, prior to its coating with a diamond-like carbon film, be pretreated by cleaning and scrubbing away of molecular or atomic debris residing thereon which might otherwise interfere with the adhesion of the DLC coating film deposited thereon. Cleaning of the abrasive article before or during DLC coating can be accomplished with an inert plasma or an ion beam, such as comprised of ions derived from argon, helium, krypton, xenon, or a member of Group 8 of the Periodic Table. Argon is preferred as the scrubbing plasma due to its cost and availability.

The hard carbon coating layer of diamond-like carbon material is applied on the abrasive article in such a way as to not substantially degrade, destroy or deteriorate the organic binder layer or layers. That is, during the application of the hard carbon coating layer, care must be taken not to destroy or adversely affect these organic binders due to exposure to excessive heat. Therefore, care must be taken not to generate excessive heat during the application of the hard carbon coating layer. Further, importantly, excessive heat may cause undesired graphitization of the diamond-like carbon material. Therefore, to restrain the temperature build-up of the abrasive article otherwise occuring during formation of the diamond-like carbon film, the deposition process can be performed in intermittent pulses of limited duration, such as from about 5 to 30 seconds, with intervening cool-off periods of about 5 to 120 seconds. As a general requirement, the temperature of the abrasive article should be maintained below about 200 degrees Celsius at all times during the formation of the diamond-like carbon film so as (1) to prevent damage to all of the make coat, and/or size coat, and/or any supersize coat, and (2) to prevent graphitization of the diamond-like carbon film itself. To ensure a uniform coating, two solenoids (approximately 25.4 cm in diameter) are located along the length of the chamber to transport the plasma created at the cathode surface away from it and toward the abrasive article. DC currents of between 0 and 30 Amperes drawn through these coils provide axial magnetic fileds of up to 150 Gauss, sufficient to direct the plasma but not large enough to damage the sample due to increased flux.

Abrasive Articles

Abrasive articles typically comprise a plurality of abrasive particles and a binder. For a coated abrasive the binder bonds the abrasive particles to a backing. The usual method of providing an abrasive article is to apply a resinous organic make coat on the substrate, apply the abrasive particles by a known technique (e.g., electrostatic, magnetic, or drop coating) onto the make coat, at least partially cure the make coat, apply a resinous size coat over the abrasive particles, cure, and optionally apply a resinous supersize coat over the size coat. The article can be then again heated to totally cure all the resin layers. Those of skill in the art will be familiar with the suitable materials and manners of practicing this process of forming the abrasive coating and size coat(s). In the present invention, it has been found optimal that before applying the hard carbon coating layer of diamond-like carbon material, it is preferred that any resinous layers already existing on the article be sufficiently cured as to maintain their integrity during the application of the hard carbon coating layer. However, it is within the scope of this invention that the resinous layers can be further cured after the diamond-like carbon film is applied.

The substrate may contain a backing treatment, such as a primer, presize, backsize, and/or saturant. Alternatively, the substrate may be devoid of any backing treatment.

A more detailed description of how to make a coated abrasive article of the invention with various layers is provided below. In general, the coated abrasive will have make and size coats, but the other layers or coats are optional. First, the substrate can be saturated with a saturant coat precursor by any conventional technique such as dip coating, roll coating, powder coating, or hot melt coating. The saturant coat precursor, the backsize coat precursor, presize coat precursor, the make coat precursor, the size coat precursor, and the supersize coat precursor are at least either dried or partially cured such that the coat is dry to the touch before the next coat is applied. These coats can be fully cured before the next coat is applied. After the last coat is applied, and if necessary, the remaining partially cured coats are fully cured. After the saturant coat is applied, the backsize or presize coat precursors are applied by any conventional technique such as roll coating, die coating, powder coating, hot melt coating, or knife coating. The make coat precursor is applied over the optional presize by any conventional technique such as spray coating, roll coating, die coating, powder coating, hot melt coating, or knife coating. The abrasive particles are projected into the make coat precursor, before the drying or partial curing step. Typically the abrasive particles are projected by an electrostatic coating process, although they could be drop coated or magnetically coated. Then the size coat precursor is applied over the abrasive particles by any conventional technique. The supersize coat precursor is applied over the size coat by any conventional technique. Finally, the coated abrasive can be subsequently further cured, humidified, or flexed, if so desired. As described above, the DLC coating is applied either over the make and/or size coats.

The abrasive article may also be a slurry coated abrasive article known as a lapping abrasive. As explained hereinabove, for a lapping abrasive, the abrasive slurry, comprising the abrasive particles and resinous adhesive binder, is coated onto at least one side of a substrate. This abrasive coating can be textured or smooth. The preferred substrate is a polymeric film, such as polyester terephthalate film that contains a primer. This coating can be accomplished by spraying, roll coating, dip coating or knife coating. After the coating process, the resinous adhesive is solidified by exposure to an energy source. Under some coating conditions, patterns known as Benard cells may occur in slurry coated abrasives.

Another method to make a structured abrasive article is described in the assignees U.S. Pat. Nos. 5,152,917 (Pieper et al), 5,304,223 (Pieper et al.), and U.S. Pat. No. 5,435,816 (Spurgeon et al.). One method involves 1) introducing the abrasive slurry onto a production tool, wherein the production tool has a specified pattern, 2) introducing a backing to the outer surface of the production tool such that the slurry wets one major surface of the backing to form an intermediate article; 3) at least partially curing or gelling the resinous adhesive before the intermediate article departs from the outer surface of the production tool to form a structured coated abrasive article; and 4) removing the coated abrasive article from the production tool. Another method involves 1) introducing the abrasive slurry onto the backing such that the slurry wets the front side of the backing to form an intermediate article; 2) introducing the intermediate article to a production tool having a specified pattern; 3) at least partially curing or gelling the resinous adhesive before the intermediate article departs from the outer surface of the production tool to form a structured coated abrasive article; and 4) removing the structured coated abrasive article from the production tool. If the production tool is made from a transparent material, e.g., a polypropylene or polyethylene thermoplastic, then either visible or ultraviolet light can be transmitted through the production and into the abrasive slurry to cure the resinous adhesive. Alternatively, if the coated abrasive backing is transparent to visible or ultraviolet light, visible or ultraviolet light can be transmitted through the coated abrasive backing. In these two methods, the resulting solidified abrasive slurry or abrasive composite will have the inverse pattern of the production tool. By at least partially curing or solidifying the binder precursor while in contact with the production tool, the abrasive composite has a generally precise and predetermined pattern. The resinous adhesive can be further solidified or cured off the production tool.

The abrasive articles of the current invention can be in the form of endless belts, sheets, discs, tapes, rolls, and the like. The abrasive article can be converted into its desired shape and size before the layer of hard coating. Alternatively, the hard carbon coating layer of DLC can be applied before the article is converted into its final form.

Abrasive Particle

The abrasive particle useful in the present invention can be any particle known in the art. The abrasive particle typically has a particle size ranging from about 0.1 to about 1500 micrometers, usually between about 100 to about 1300 micrometers. It is preferred that the abrasive particle has a Mohs' hardness of at least about 6, more preferably above 8. Examples of such abrasive particles can be selected from fused aluminum oxide, ceramic aluminum oxide, heat treated aluminum oxide, white fused aluminum oxide, silicon carbide, alumina zirconia, boron carbide, titanium diboride, titanium dicarbide, titanium nitride, diamond, ceria, cubic boron nitride, garnet, and combinations thereof. Examples of ceramic aluminum oxides can be found in U.S. Pat. Nos. 4,314,827; 4,623,364; 4,744,802; 4,770,671; 4,881,951; 4,964,883, and 5,201,916. The term abrasive particle also encompasses individual abrasive particles bonded together to form an abrasive agglomerate. Abrasive agglomerates are further described in U.S. Pat. Nos. 4,652,275 and 4,799,939, incorporated herein after by reference. One preferred abrasive particle of the present invention comprises alpha alumina and at least one metal oxide modifier. Examples of such metal oxide modifiers include oxides of: zirconium, hafnium, cobalt, nickel, zinc, magnesium, titanium, silicon, praseodymium, sarmarium, ytterbium, neodymium, lanthanum, gadolinium, cerium, dysprosium, yttrium, erbium, and combinations thereof. The preferred metal oxide modifiers are magnesia, yttria, and rare earth oxides. Typically, the abrasive particle of the invention comprises between about 50 to about 99.9%, preferably about 80 to about 99.5%, more preferably about 90 to about 99%, and most preferably between about 93 to about 99% by weight alpha alumina, and between about 0.1 to about 30% by weight, preferably between about 0.1 to about 15%, more preferably between about 0.5 to about 10%, and most preferably about 0.5 to about 5% by weight metal oxide modifier. These weight ranges are based upon an elemental oxide basis.

The metal oxide modifier can react with the alumina to form a reaction product and/or the modifier can remain as the metal oxide. For example the oxides of cobalt, nickel, zinc, and magnesium react with alumina to form spinels, whereas zirconia and hafnia do not form spinels with alumina. The alumina and rare earth oxide may react to form a reaction product. For instance, the oxide of the reaction product of dysprosium and gadolinium with aluminum will generally be a garnet. The oxide of the reaction product of praseodymium, ytterbium, erbium, and samarium with aluminum will generally be perovskite (which may include garnet). In another instance alumina, a divalent metal cation, and rare earth metal oxides may react to form a hexagonal rare earth aluminate $MAl_{11}LnO_{19}$. Where M is a divalent metal cation and Ln is a trivalent metal ion such as La, Nd, Ce, Pr, Sm, Gd, or Eu. The divalent metal cation may be manganese, magnesium, calcium, and the like. This hexagonal rare earth aluminate has exceptional properties in an abrasive particle.

The abrasive particle should have a density of at least 80% typically at least 90% preferably at least 93%, more preferably at least 95%, of the theoretical value. The density can be measured by any conventional technique.

The abrasive particle of this invention may also contain a surface coating. Surface coatings are known to improve the adhesion between the abrasive particle and the binder in the abrasive article. Such surface coatings are described in U.S. Pat. Nos. 5,011,508; 1,910,444; 3,041,156; 5,009,675; 4,997,461; 5,042,991 and 5,213,591 incorporated herein by reference.

Substrate

Examples of typical abrasive substrates for abrasive articles of this invention include sheet and sheet-like materials. The substrate can be a flexible material such as polymeric film, primed polymeric film, cloth (including greige cloth), paper, vulcanized fiber, thermoplastics, nonwovens, metal (including metal substrates, metal foils, and the like), and treated versions thereof, and combinations thereof. Other examples of backings are described in PCT published application WO 93/12911 (Benedict et al.) and U.S. Pat. No. 5,316,812 (Stout et al.). Thicker rigid polymeric composites or metal backing may also be used as the substrate.

Binder

The organic binder for the make, size, and supersize coats usable in this invention is formed from either a thermoplastic or a thermosetting resin adhesive. The resinous adhesive is selected such that it has the suitable properties necessary for an abrasive article binder. Examples of typical resinous adhesives include phenolic resins, aminoplast resins having pendant alpha, beta unsaturated carbonyl groups, urethane resins, epoxy resins, ethylenically unsaturated resins, acrylated isocyanurate resins, urea-formaldehyde resins, isocyanurate resins, acrylated urethane resins, acrylated epoxy resins, bismaleimide resins, fluorene modified epoxy resins and mixtures thereof. Depending upon the particular resinous adhesive, the binder precursor may further include a catalyst or curing agent. The catalyst and/or curing agent will either help to initiate and/or accelerate the polymerization process. The binders may be thermally or radiation cured.

Phenolic resins are widely used in abrasive article binders because of their thermal properties, availability, cost and ease of handling. There are two types of phenolic resins, resole and novolac. Resole phenolic resins have a molar ratio of formaldehyde to phenol of greater than or equal to one to one, preferably between 1.5:1.0 to 3.0:1.0. Novolac resins have a molar ratio of formaldehyde to phenol less than one to one. Examples of commercially available phenolic resins include those known by the tradenames "DUREZ" and "VARCUM" from Occidental Chemicals Corp.; "RESINOX" from Monsanto; "AROFENE" from Ashland Chemical Co. and "AROTAP" from Ashland Chemical Co.

The abrasive coating and/or binder coats may optionally further comprise optional additives, such as fillers, grinding aids, fibers, lubricants, wetting agents, surfactants, pigments, antifoaming agents, antistatic agents, dyes, coupling agents, plasticizers, and suspending agents. The amounts of these materials are selected to provide the properties desired. Examples of fillers include calcium carbonate, calcium metasilicate, silica, silicates, sulfate salts, and combinations thereof. Examples of grinding aids include cryolite, ammonium cryolite, chiolite, sodium chloride, sulfur, polyvinyl chloride, and potassium tetrafluoroborate. Examples of antistatic agents usable in the abrasive coating include graphite, carbon black, vanadium oxide, humectants, and the like. An example of a suspending agent is an amorphous silica particle having a surface area about 150 $m^2/g$ that is commercially available from DeGussa Corp., under the trade name "OX-50".

Method of Refining a Workpiece Surface

Another embodiment of this invention pertains to a method of refining a workpiece surface. This method involves bringing into frictional contact the abrasive article of this invention with a workpiece. The term refine means that a portion of the workpiece is abraded away by the abrasive article. Additionally, the surface finish associated with the workpiece surface is reduced after this refining process. One typical surface finish measurement is Ra; Ra is the arithmetic surface finish generally measured in microinches or micrometers. The surface finish can be measured by a profilometer, such as a Perthometer or Surtronic.

Workpiece

The workpiece can be any type of material such as metal, metal alloys, exotic metal alloys, ceramics, glass, wood, wood like materials, composites, painted surface, plastics, reinforced plastic, stones, and combinations thereof. The workpiece may be flat or may have a shape or contour associated with it. Examples of workpieces include glass eye glasses, plastic eye glasses, plastic lenses, glass television screens, metal automotive components, plastic components, particle board, cam shafts, crank shafts, furniture, turbine blades, painted automotive components, magnetic media, and the like.

Depending upon the application, the force at the abrading interface can range from about 0.1 kg·force to over 1000 kg·force. Generally this range is between 1 kg to 500 kg of force at the abrading interface. Also depending upon the application, there may be a liquid present during abrading. This liquid can be water and/or an organic compound. Examples of typical organic compounds include lubricants, oils, emulsified organic compounds, cutting fluids, soaps, or the like. These liquids may also contain other additives such as defoamers, degreasers, corrosion inhibitors, or the like. The abrasive article may oscillate at the abrading interface during use. In some instances, this oscillation may result in a finer surface on the workpiece being abraded.

The abrasive article of the invention can be used by hand or used in combination with a machine. At lest one or both of the abrasive article and the workpiece is moved relative to the other. The abrasive article can be converted into a belt, tape rolls, disc, sheet, and the like. For belt applications, the two free ends of an abrasive sheet are joined together and a splice is formed. Generally the endless abrasive belt traverses over at least one idler roll and a platen or contact wheel. The hardness of the platen or contact wheel is adjusted to obtain the desired rate of cut and workpiece surface finish. Again this belt speed depends upon the desired cut rate and surface finish. The belt dimensions can range from about 5 mm to 1,000 mm wide and from about 5 mm to 10,000 mm long. Abrasive tapes are continuous lengths of the abrasive article. They can range in width from about 1 mm to 1,000 mm, generally between 5 mm to 250 mm. The abrasive tapes are usually unwound, traverse over a support pad that forces the tape against the workpiece and then rewound. The abrasive tapes can be continuously feed through the abrading interface and can be indexed. The abrasive disc, which also includes what is known in the abrasive art as "daisies" can range from about 50 mm to 1,000 mm in diameter. Typically abrasive discs are secured to a back-up pad by an attachment means. These abrasive discs can rotate between 100 to 20,000 revolutions per minute, typically between 1,000 to 15,000 revolutions per minute.

The features and advantages of the present invention are further illustrated by the following non-limiting examples. All parts, percentages, ratios, and the like, in the examples are by weight unless indicated otherwise.

EXAMPLES

General Procedure for Coating the DLC Layer

The following general procedure describes the method for forming a diamond-like carbon coating film layer on an abrasive-coated disc of the invention.

For cathodic arc deposition, a disc coated with the make coat and abrasive particles, as described below, was placed in a holder in a vacuum system. The horizontal confined-type cathodic apparatus used in the present invention was similar to that described in U.S. Pat. No. 3,836,451 (Snaper), which is incorporated herein by reference. A water-cooled copper block held the cathode. The cathode and anode were each electrically isolated from the vacuum chamber and connected to a DC welding power supply (INTELLIWELD 650, available from Miller Welding Co.). The sample holder was positioned to receive the maximum coating flux using the horizontal confined-type cathodic arc apparatus. This apparatus had a cathode target material installed which was one of a vitreous carbon source or a graphite source, as indicated in the examples. A SIGRADUR G vitreous carbon cathode was used which was commercially available from Sigri Corp., Somerville, N.J., in the form of three 1.27 cm×5.1 cm×0.4 cm plates forming a 1.27 cm rectangular cross-sectional area to produce diamond-like carbon coatings. The graphite cathode was commercially available and obtained from Poco Graphite, Inc., Decatur, Tex., under the designation "SFG-1" and had a 2.5 cm diameter and a 7 cm length.

The cathodic coating apparatus was further equiped with a magnetic solenoid as described in Gilmore et al., "Pulsed Metallic-Plasma Generators," Proceeding of the IEEE, V. 60, No. 8, pp. 977–991. The distance between the target and holder plate for the abrasive disc sample being coated was about 90 cm, and the vacuum vessel was about 40 cm in diameter. The abrasive disc was offset from the center so that when it was rotated the outer 5 cm portion of the disc would be covered by the focused plasma, and thus uniformly coat the grinding portion of the disc.

Before plasma depositing the diamond-like carbon film, the chamber was evacuated to form and maintain a base pressure of less than $10^{-4}$ torr for about 30 minutes to remove any volatile moisture constituents present in the make coat of the abrasive article. Following this, the abrasive article was cleaned by using an argon ion gun which was mounted at a 45° angle to the chamber. Sputter cleaning was performed using argon at a pressure of about $8\times10^4$ torr with a beam energy of 500–1500 volts and a beam current of 5–500 mA. This was immediately followed by striking the arc discharge and depositing the DLC film in multiple steps of up to 100, but preferably 5–10 on/off cycles with the arc current maintained at 50–500 amps, preferably 100 amps, axial magnetic field of 0–150 Gauss, preferably 2–20 Gauss, and chamber pressure less than $10^{-4}$ torr, but preferably less than $10^{-6}$ torr. The preferred embodiment of the invention uses a sequence of separate steps of argon cleaning followed by DLC formation. In this regard, argon cleaning of the abrasive particles was performed in argon plasma at a feed rate of about 2 cm$^3$/minute. The total diamond-like carbon film coating time was between about 0.5 minutes and 3 minutes, as indicated in the examples.

General Procedure for Making the Abrasive Discs

The following general procedure describes how the coated abrasive discs were made for the examples. A make resin was coated onto a 0.76 mm thick vulcanized fibre disc about 17.8 cm in diameter with a 2.2 cm center hole. The make resin comprised by weight 48% a resole phenolic resin and 52% calcium carbonate and was diluted to 81% solids with water and glycol ether solvent. The wet make resin coating weight was about 140 grams/m$^2$. Abrasive particles were then electrostatically coated into the wet make resin. The resulting construction was heated at 77° C. for 15 minutes, then heated at 93° C. for 4 hours to cure the make resin and form an abrasive coating. The DLC coating was then applied over the cured make resin and abrasive particles of the abrasive coating in the manner generally described above. A size resin was then coated over the DLC coating with an average weight of about 670 grams/m$^2$. The size resin was diluted to 78% solids with water and glycol ether solvent and consisted of 32% resole phenolic resin and 68% cryolite. The size resin was cured at 77° C. for one hour afterwhich at 102° C. for 12 hours.

Test Procedure I

Test Procedure I was designed to measure the cut rate of the disc and the amount of metal removed. The coated abrasive disc was mounted on a beveled aluminum back-up pad and used to grind the face of a 1.25 cm by 18 cm workpiece of a material indicated in the examples. The disc was driven at 5,500 rpm while the portion of the disc overlaying the beveled edge of the back-up pad contacted the workpiece at about a 6 kg load. Each disc was used to grind a separate workpiece for a one minute interval until the test endpoint. The initial cut was the amount of metal, in grams, removed in the first minute of grinding. Likewise, the final cut was the amount of metal, in grams, removed in the last minute of grinding and the total cut was the summation of the amount of metal, in grams, removed throughout the entire test. In most of the examples, the performance of the abrasive article was stated as percent of control, that is the total amount of metal removed for the control example (average, if any) was equated to 100% and the abrasive article of the examples was measured relative to the control (100%).

Several Examples below had more than one disc prepared in the same manner and tested. The individual discs for each example are denoted in the tabulated data hereinafter by the convention "Example number-run number" along with the average value of any multiple runs of an example.

EXAMPLE 1

An abrasive article was prepared by the General Procedure for Making the Abrasive Discs. The abrasive particle of the disc construction was a sol gel alumina based grain comprising alumina, magnesia, yttria, and rare earth oxides, commercially available from 3M Company, St. Paul, Minn. under the trade designation "321 Cubitron" grain. The hard carbon coating layer of diamond-like carbon film was formed on the abrasive coating according to the General Method of Preparing the Layer of DLC under a vacuum atmosphere of $10^{-5}$ torr and with the vitreous carbon cathode. The diamond-like carbon layer was formed over the resin make coat and abrasive particles with a 90 second total coating time period. The size coat was then coated over the DLC film. Two separate abrasive disc samples were prepared in the above manner to provide abrasive discs designated 1-1 and 1-2.

EXAMPLE 2

An abrasive article was prepared in the same manner as Example 1 except that argon was introduced to maintain a system pressure between $1\times10^{-4}$ torr to $5\times10^{-4}$ torr during the DLC coating procedure, and not before DLC coating as a separate treatment operation as was done in Example 1.

Comparative Example A

Comparative abrasive article (A) was prepared in the same manner as Example 1 except that no DLC film was formed between the abrasive coating and the size coat. Two separate abrasive disc samples A-1 and A-2 were prepared for Comparative Example (A).

Examples 1 and 2 and Comparative Example A were tested on 4150 mild steel workpieces for at least 20 total minutes using Test Procedure I. Comparative Example A was designated the control. For these Examples 1, 2 and Comparative Example A, the grinding endpoint for Test Procedure I was established as when the cut rate was one third of the initial cut rate. The results, including the arithmetical average (avg.) or mean value for the different samples of any one example, are shown in Table 1 below.

TABLE 1

|   | Initial cut (g) | Final Cut (g) | Total Cut (g) | % Total Cut | Time (min) |
| --- | --- | --- | --- | --- | --- |
| A-1 | 75.51 | 22.19 | 1362.23 | 103 | 20 |
| A-2 | 76.03 | 24.07 | 1283.75 | 97 | 21 |
| A (avg.) | 75.77 | 23.13 | 1322.99 | 100 | — |
| 1-1 | 77.55 | 25.50 | 1354.83 | 102 | 21 |
| 1-2 | 83.28 | 27.10 | 1664.20 | 126 | 24 |
| 1 (avg.) | 80.42 | 26.30 | 1509.52 | 114 | — |
| 2 | 70.11 | 23.17 | 1333.42 | 101 | 22 |

The data demonstrated the superior results achieved by Examples 1 and 2 (intermediate DLC film), especially Example 1 (with argon pretreatment), as compared with Comparative Example A (no DLC film) in terms of all of final cut, total cut and % total cut. Example 1 was also superior to Comparative Example A in initial cut as well.

EXAMPLE 3

As a check on the reproducibility of the results of the foregoing examples, six separate abrasive disc articles were made in the same manner as Example 1 to provide runs 3-1 to 3-6.

Comparative Example B

A comparative abrasive article (B) was prepared in the same manner as Comparative Example A. Examples 3-1 through 3-6 and Comparative Example B tested according to Test Procedure I as performed on 4150 mild steel workpieces for 20 total minutes. The results, including the arithmetical average (avg.) or mean value and standard deviation ($\sigma_{n-1}$) for the separate samples of Example 3, are summarized in Table 2 below.

TABLE 2

| Run | Total Cut (g) | % Total Cut |
| --- | --- | --- |
| B | 1666.54 | 100 |
| 3-1 | 1879.66 | 113 |
| 3-2 | 2071.35 | 124 |
| 3-3 | 2072.41 | 124 |
| 3-4 | 1890.97 | 114 |
| 3-5 | 1941.50 | 117 |
| 3-6 | 1564.30 | 94 |
| 3 (avg.) | 1903.37 | 114 ± 11.0 |

The results, with one exception, confirmed and clearly demonstrated the superior results achieved by Example 3 runs (intermediate DLC film) as compared with Comparative Example B (no intermediate DLC film) in terms of all of total cut and % total cut.

Although, the results for run 3-6 did not fit the overall trend, visual observation of sample 3-6 revealed delamination of the DLC from the abrasive coating, which did not occur in samples 3-1 to 3-5, which indicated a manufacturing anomoly had been inadvertently introduced into sample 3-6. Accordingly sample 3-6 should not be considered representative. The average total cut and % total cut for runs 3-1 to 3-5 (excluding run 3-6) was 1971.18 and 118±5.3, respectively.

EXAMPLE 4

Five samples of abrasive articles designated 5-1 to 5-5 were made in the same manner as Example 1 except that the DLC film was coated over a total coating period of three minutes.

EXAMPLE 5

Six samples of abrasive articles designated 5-1 through 5-6 were made in the same manner as Example 1 except that the DLC film was coated using the "POCO" graphite cathode material and DLC coating was conducted for a total coating period of 1 minute.

Comparative Example C

A comparative abrasive article (C) was made in the same manner as Comparative Example A. Three separate abrasive disc samples C-1 to C-3 were prepared for Comparative Example (C).

Examples 4, 5 and Comparative Example C were tested on 304 stainless steel workpieces using Test Procedure I. The endpoint was established as when the cut rate became one third of the initial cut rate. The results, including the arithmetical average (avg.) or mean value and standard deviation ($\sigma_{n-1}$) for multiple samples tested for any one example, are summarized in Table 3 below.

TABLE 3

|   | Total Cut (g) | % Total Cut |
| --- | --- | --- |
| C-1 | 172.9 | 137 |
| C-2 | 106.3 | 84 |
| C-3 | 100.3 | 79 |
| C (avg.) | 126.5 | 100 ± 32.1 |
| 4-1 | 171.2 | 135 |
| 4-2 | 141.0 | 112 |
| 4-3 | 122.9 | 97 |
| 4-4 | 169.9 | 134 |
| 4-5 | 200.1 | 158 |
| 4 (avg.) | 161.0 | 127 ± 23.4 |
| 5-1 | 166.7 | 132 |
| 5-2 | 155.3 | 123 |
| 5-3 | 204.1 | 161 |
| 5-4 | 157.9 | 125 |
| 5-5 | 206.5 | 163 |
| 5-6 | 237.6 | 188 |
| 5 (avg.) | 188.0 | 149 ± 26.1 |

The overall trend of the data clearly statistically demonstrated the superior results and consistency achieved by Examples 4 and 5 (intermediate DLC film) as compared with Comparative Example C (no DLC film) in terms of all of final cut, total cut and % total cut. The improvements achieved in Example 5 where DLC coating was performed with a "POCO" graphite target were even more remarkably superior.

EXAMPLE 6

Abrasive articles were prepared by the General Procedure for Making the Abrasive Discs with the exception that sequence of forming the DLC coating and the size coat were switched such that the DLC coating was formed as a top coat over the size coat. In this regard, Examples 6-1, 6-3, and 6-4 had DLC top coats formed on the size coat for 72 seconds, while Example 6-2 had the DLC top coat formed by coating the size coat for 84 seconds. The DLC films were coated using the "POCO" graphite cathode material. A Comparative abrasive article (D) was made in the same manner as Comparative Example A for comparison purposes. Three separate samples D-1 to D-3 were prepared for Comparative Example (D).

Examples 6-1 through 6-4 and Comparative Example D tested according to Test Procedure I as performed on 304 stainless steel workpieces for 10 total minutes. The results, including arithmetical average (avg.) or mean values and the standard deviation values thereof, are summarized in Table 6 below.

TABLE 6

| Run | Total Cut (g) | % Total Cut |
|---|---|---|
| D-1 | 213.7 | 108 |
| D-2 | 193.8 | 98 |
| D-3 | 185.6 | 94 |
| D (avg.) | 197.7 | 100 ± 7.2 |
| 6-1 | 203.3 | 103 |
| 6-2 | 205.6 | 104 |
| 6-3 | 192.8 | 98 |
| 6-4 | 219.3 | 111 |
| 6 (avg.) | 205.3 | 104 ± 5.4 |

The data clearly statistically demonstrated the superior results and consistency achieved by Example 6 (top coat DLC film) as compared with Comparative Example D (no DLC film) in terms of total cut and % total cut.

Various modifications and alterations of this invention will become apparent to those skilled in the art without departing from the scope and spirit of this invention, and it should be understood that this invention is not to be unduly limited to the illustrative embodiments set forth herein.

We claim:

1. An abrasive article, comprising:
   (a) a substrate having at least one major surface;
   (b) an abrasive coating adhered to said at least one major surface of said substrate, wherein said abrasive coating comprises a plurality of abrasive particles and an organic binder medium; and
   (c) a hard carbon coating layer comprising an amorphous diamond-like carbon film having a plasmon energy of 26 eV or more, on at least a portion of an outer surface of said abrasive coating.

2. The abrasive article of claim 1, wherein said hard carbon coating layer covers the entire outer surface of said abrasive coating.

3. The abrasive article of claim 1, wherein said abrasive coating comprises a three dimensional nonplanar outer surface extending away from said at least one major surface.

4. The abrasive article of claim 1, wherein said abrasive coating comprises a plurality of precisely-shaped three-dimensional abrasive composites attached to said substrate, said abrasive composites each comprising a plurality of abrasive particles dispersed in an organic binder.

5. The abrasive article of claim 1, wherein said diamond-like carbon film has a plasmon energy of 26–32 eV.

6. The abrasive article of claim 1, wherein said hard carbon coating layer has an average thickness of less than 50 micrometers.

7. The abrasive article of claim 1, wherein said hard carbon coating layer has an average thickness of between 100 and 5,000 Angstroms.

8. An abrasive article, comprising:
   (a) a substrate having at least one major surface;
   (b) an abrasive coating adhered to said at least one major surface of said substrate, wherein said abrasive coating comprises a plurality of abrasive particles and an organic binder medium;
   (c) a hard carbon coating layer comprising an amorphous diamond-like carbon film having a plasmon energy of 26 eV or more, on at least a portion of an outer surface of said abrasive coating; and
   (d) a first size coat layer comprising an organic binder medium adhered onto said hard carbon coating layer.

9. The abrasive article of claim 8, further comprising a second size coat layer composed of an organic binder medium located between said abrasive coating and said hard carbon coating layer.

10. The abrasive article of claim 8, wherein said abrasive particles are at least partially embedded in said organic binder medium of said abrasive coating.

11. The abrasive article of claim 8, wherein said hard carbon coating layer has an average thickness of less than 50 micrometers.

12. The abrasive article of claim 8, wherein said hard carbon coating layer has an average thickness of between 100 and 5,000 Angstroms.

13. The abrasive article of claim 8, wherein said abrasive particles are selected from the group consisting of alumina and silicon carbide.

14. The abrasive article of claim 8, wherein said coated abrasive article is a disc.

15. The abrasive article of claim 8, wherein said diamond-like carbon film has a plasmon energy of 26–32 eV.

16. The abrasive article of claim 1, wherein said diamond-like carbon film has a plasmon energy of 26–30 eV.

17. The abrasive article of claim 8, wherein said diamond-like carbon film has a plasmon energy of 26–30 eV.

* * * * *